(12) United States Patent
Hamon et al.

(10) Patent No.: US 12,391,819 B2
(45) Date of Patent: *Aug. 19, 2025

(54) FLUOROPOLYMER-BASED HYBRID ORGANIC/INORGANIC COMPOSITES

(71) Applicant: SYENSQO SA, Brussels (BE)

(72) Inventors: Christine Hamon, Bollate (IT); Ségolène Brusseau, Tavaux (FR); Riccardo Rino Pieri, Milan (IT); Julio A. Abusleme, Saronno (IT)

(73) Assignee: SYENSQO SA, Brussels (BE)

( * ) Notice: Subject to any disclaimer, the term of this patent is extended or adjusted under 35 U.S.C. 154(b) by 975 days.

This patent is subject to a terminal disclaimer.

(21) Appl. No.: 16/771,661

(22) PCT Filed: Dec. 11, 2018

(86) PCT No.: PCT/EP2018/084298
§ 371 (c)(1),
(2) Date: Jun. 10, 2020

(87) PCT Pub. No.: WO2019/115502
PCT Pub. Date: Jun. 20, 2019

(65) Prior Publication Data
US 2021/0189041 A1 Jun. 24, 2021

(30) Foreign Application Priority Data
Dec. 13, 2017 (EP) .................................. 17306761

(51) Int. Cl.
| | | |
|---|---|---|
| *C08F 259/08* | (2006.01) |
| *B01D 69/14* | (2006.01) |
| *B01D 71/02* | (2006.01) |
| *B01D 71/34* | (2006.01) |
| *C03C 17/00* | (2006.01) |
| *C08F 214/22* | (2006.01) |
| *C08K 3/36* | (2006.01) |
| *C09D 5/22* | (2006.01) |
| *C09D 5/24* | (2006.01) |
| *C09D 7/61* | (2018.01) |
| *C09D 151/00* | (2006.01) |
| *H01L 51/00* | (2006.01) |
| *H01M 8/1025* | (2016.01) |
| *H01M 8/1039* | (2016.01) |
| *H01M 8/1051* | (2016.01) |
| *H01M 10/0525* | (2010.01) |
| *H01M 50/426* | (2021.01) |
| *H01M 50/437* | (2021.01) |

(Continued)

(52) U.S. Cl.
CPC .............. *C08K 3/36* (2013.01); *B01D 69/148* (2013.01); *B01D 71/027* (2013.01); *B01D 71/34* (2013.01); *C03C 17/009* (2013.01); *C08F 214/225* (2013.01); *C08F 259/08* (2013.01); *C09D 5/22* (2013.01); *C09D 5/24* (2013.01); *C09D 7/61* (2018.01); *C09D 151/003* (2013.01); *H01M 8/1025* (2013.01); *H01M 8/1039* (2013.01); *H01M 8/1051* (2013.01); *H01M 10/0525* (2013.01); *H01M 50/426* (2021.01); *H01M 50/437* (2021.01); *H01M 50/446* (2021.01); *H10K 85/141* (2023.02); *H10K 85/151* (2023.02); *C08F 2800/10* (2013.01); *C08F 2810/20* (2013.01); *C08F 2810/50* (2013.01); *H01M 2008/1095* (2013.01); *H01M 2300/0082* (2013.01); *H01M 2300/0091* (2013.01); *H10K 30/00* (2023.02); *H10K 30/50* (2023.02); *H10K 50/11* (2023.02)

(58) Field of Classification Search
CPC .... B01D 69/148; B01D 71/027; B01D 71/34; C03C 17/009; C08F 214/225; C08F 2800/10; C08F 2810/20; C08F 2810/50; C08F 259/08; C08K 3/36; C09D 5/22; C09D 5/24; C09D 151/003; C09D 7/61; H01M 8/1025; H01M 8/1039; H01M 8/1051; H01M 10/0525; H01M 2008/1095; H01M 2300/0082; H01M 2300/0091; H01M 50/446; H01M 50/426; H01M 50/437; H10K 30/00; H10K 50/11; H01L 51/0043; H01L 51/004
USPC ......................................................... 429/492
See application file for complete search history.

(56) References Cited

U.S. PATENT DOCUMENTS

| | | |
|---|---|---|
| 6,620,516 B1 | 9/2003 | Kurihara et al. |
| 7,244,797 B2 | 7/2007 | Kurihara et al. |
| 2014/0004432 A1* | 1/2014 | Gronwald ............ H01M 8/1069 429/492 |

FOREIGN PATENT DOCUMENTS

| | | | | |
|---|---|---|---|---|
| EP | 1389634 A1 | 2/2004 | | |
| WO | WO2011/121078 | * | 6/2011 | ............ C08F 214/18 |

(Continued)

OTHER PUBLICATIONS

Ogoshi T. et al., "Synthesis of Poly(vinylidene fluoride) (PVDF)/Silica Hybrods having interpenetrating polymer network structure by using crystallization between PVDF chains", Journal of Polymer Science: Part A: Polymer Chemistry, 2005, vol. 43, pp. 3543-3550, Wiley Periodicals, Inc.

(Continued)

*Primary Examiner* — Niki Bakhtiari
*Assistant Examiner* — Omar M Kekia
(74) *Attorney, Agent, or Firm* — Osha Bergman Watanabe & Burton LLP

(57) ABSTRACT

The invention pertains to a process for manufacturing a fluoropolymer hybrid organic/inorganic composite, to fluoropolymer hybrid organic/inorganic composites obtained therefrom and to the use of the same in several fields of use.

18 Claims, No Drawings

(51) Int. Cl.
    H01M 50/446    (2021.01)
    H10K 85/10    (2023.01)
    *H01M 8/10*    (2016.01)
    *H10K 30/00*    (2023.01)
    *H10K 30/50*    (2023.01)
    *H10K 50/11*    (2023.01)

(56) References Cited

FOREIGN PATENT DOCUMENTS

| | | |
|---|---|---|
| WO | 2011121078 A1 | 10/2011 |
| WO | 2017017023 A1 | 2/2017 |
| WO | 2017140649 A1 | 8/2017 |
| WO | 2019115500 A1 | 6/2019 |

OTHER PUBLICATIONS

Sanchez, C. et al., "Optical Properties of Functional Hybrid Organic-Inorganic Nanocomposites", Advanced Materials, 2003, vol. 15, No. 23, pp. 1969-1994, Wiley-VCH Verlag Gmbh & Co. KGaA, Weinheim.

Souzy, R. et al., "Functional Fluoropolymers for fuel cell membranes", Prog. Polym. Sci., vol. 30, 2005, pp. 644-687, Elsevier Ltd.

\* cited by examiner

FLUOROPOLYMER-BASED HYBRID ORGANIC/INORGANIC COMPOSITES

CROSS-REFERENCE TO RELATED APPLICATIONS

This application is a U.S. national stage entry under 35 U.S.C. § 371 of International Application No. PCT/EP2018/084298 filed Dec. 11, 2018, which claims priority to European application No. 17306761.2, filed on Dec. 13, 2017. The entire contents of these applications are explicitly incorporated herein by this reference.

PARTIES TO A JOINT RESEARCH AGREEMENT

The presently claimed invention was made by or on behalf of the below listed parties (through its subsidiary) to a joint research agreement. The joint research agreement was in effect on or before the date the claimed invention was made, and the claimed invention was part of the joint research agreement and made as a result of activities undertaken within the scope of the joint research agreement. The parties to the joint research agreement are Solvay SA (parent entity to Solvay Specialty Polymers Italy SpA) and COMMISSARIAT A L'ENERGIE ATOMIQUE ET AUX ENERGIES ALTERNATIVES. Solvay SA underwent a partial demerger on Dec. 8, 2023, and as a result, Solvay Specialty Polymers Italy SpA is now a wholly owned subsidiary of SYENSQO SA.

TECHNICAL FIELD

The invention pertains to certain fluoropolymer-based hybrid organic/inorganic composites with chemical bonds between the inorganic domains and the fluoropolymer phase, to a method for its manufacture, and to several uses and applications of the same.

BACKGROUND ART

Hybridization at the nanometer scale organic and inorganic compounds is an important and evolutionary way to create new materials. Organic-inorganic polymer hybrids, wherein organic polymers are dispersed in inorganic solids on a nano or molecular level, have raised a great deal of scientific, technological and industrial interests because of their unique properties.

To elaborate organic-inorganic polymer hybrids, a sol-gel process using metal alkoxides is the most useful and important approach. By properly controlling the reaction conditions of hydrolysis and polycondensation of metal alkoxydes, in particular of alkoxysilanes (e.g. tetramethoxysilane (TMOS) or tetraethoxysilane (TEOS)), in the presence of pre-formed organic polymers, it is possible to obtain hybrids with improved properties compared to the original compounds. The polymer can enhance the toughness and processability of otherwise brittle inorganic materials, wherein the inorganic network can enhance scratch resistance, mechanical properties, and surface characteristics of said hybrid.

Hybrids made from sol-gel technique starting from fluoropolymers, in particular from vinylidene fluoride polymers are known in the art.

Thus, paper OGOSHI, Tomoki, et al. Synthesis of Poly (vinylidene fluoride) (PVDF)/Silica Hybrods having interpenetrating polymer network structure by using crystallization between PVDF chains. (A) *J. polym. sci., A, Polym. chem.* 2005, vol. 43, p. 3543-3550. discloses the synthesis of certain PVDF/silica hybrids by reacting a solution in DMF and gamma-butirolactone of PVDF with TMOS in the presence of a catalytic amount of HCl.

Nevertheless, despite the in situ formation of the inorganic domains which should provide for high dispersionability, it happens that these interface among organic phase and inorganic phase represent disrupting surfaces which might behave as weakness points depleting advantages in mechanical properties, and/or might cause inorganic domain to 'coagulate' to a large extent depleting the homogeneity advantages, e.g. in adhesion and/or other surface properties.

Attempts have been made in the art for ensuring chemical bonding among certain organic polymers and certain inorganic domains dispersed therein, via techniques differing from the sol/gel above mentioned.

Thus, U.S. Pat. No. 6,620,516 (ASAHI KASEI KK) 16 Sep. 2003 discloses an organic domain/inorganic domain hybrid material wherein the organic domain comprises a water-soluble or water-dispersible organic polymer having a plurality of carboxylic acid groups, and the organic domain and the inorganic domain being ionically bonded to each other through the carboxylic groups of the organic polymer to form an ionically crosslinked structure. These hybrids are manufactured by reaction between the organic polymer as above detailed and certain metasilicate anions in an aqueous medium under basic conditions in the presence of certain divalent metal cations which will ensure the formation of the ionic network through simultaneous ionic chemical bond to the carboxylate and silicate groups.

Similarly, U.S. Pat. No. 7,244,797 (ASAHI KASEI KK) Jul. 17, 2007 discloses a similar approach, wherein, in addition, the organic polymer can comprise cationic functionalities (e.g. quaternary ammonium groups) which are ionically bound to the metasilicate function of the inorganic domain.

Nevertheless, these approaches have not been proposed as suitable for fluoropolymers.

SOUZY, Renaud, et al. Functional Fluoropolymers for fuel cell membranes. *Prog. Polym. Sci.* 2005, vol. 30, p. 644-687. discloses in its section 3.3.2 composite membrane notably made by formation of an interpenetrating network of the organic and inorganic fractions. As an example, sol-gel acid-catalyzed hydrolysis/polymerization of tetraethoxysilane (TEOS) on NAFION® pre-formed fluoroionomer membrane is mentioned as yielding a Nafion®-silica hybrid membrane.

EP 1389634 A (DAIKIN INDUSTRIES LTD) Feb. 18, 2004 discloses a surface-treatment agent comprising:
  a) a hydrolyzable metal alkoxyde, which can be notably TEOS;
  b) a fluorocompound comprising a perfluoroalkyl group and a functional group reactive towards the above mentioned metal hydrolyzable compound; and
  c) an adhesion improvement agent.

In preferred embodiments, compound b) is a perfluoropolyether comprising functional groups of formula:

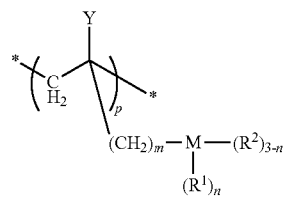

wherein Y is H or lower alkyl group; m and n is from 0 to 2; R1 is a hydrolysable group or a chlorine atom; R2 is a hydrogen atom or a inert monovalent group, M is a metal or a reactive group selected from the group consisting of an isocyanate group, a carboxyl group, a hydroxyl group, a glycidyl group, a phosphate group, an amino group, and a sulfonate group.

There is thus still a shortfall in the art for fluoropolymer-based hybrid organic/inorganic composites wherein organic phases and inorganic phases are chemically bound each other through covalent bounds, which could override drawbacks of hybrids of the prior art.

SUMMARY OF INVENTION

The invention thus provides a process for manufacturing a fluoropolymer hybrid organic/inorganic composite [polymer (F-h)] comprising fluoropolymer domains and inorganic domains, said process comprising:
(a) providing a mixture of:
at least one fluoropolymer [polymer (F)] comprising:
(i) recurring units derived from at least one fluorinated monomer (FM),
(ii) recurring units derived from at least one (meth)acrylic monomer [monomer (MA)] of formula:

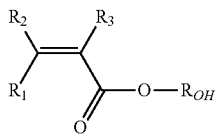

wherein each of R1, R2, R3, equal or different from each other, is independently a hydrogen atom or a $C_1$-$C_3$ hydrocarbon group, and $R_{OH}$ is a $C_1$-$C_5$ hydrocarbon moiety comprising at least one hydroxyl group, and
(iii) optionally recurring units derived from at least one fluorinated monomer (FM2) different from VDF;
wherein polymer (F) has an intrinsic viscosity measured in dimethylformamide at 25° C. higher than 0.09 l/g and lower than 0.6 l/g; and
at least one metal compound [compound (M)] of formula (I):

$$X_{4-m}AY_m \qquad (I)$$

wherein m is an integer from 1 to 4, A is a metal selected from the group consisting of Si, Ti and Zr, Y is a hydrolysable group, X is a hydrocarbon group, optionally comprising one or more functional groups,
wherein the fluoropolymer domains derives from polymer (F) and the inorganic domains derives from compound (M), and
wherein the inorganic domains are grafted to the fluoropolymer domains through reaction of at least a fraction of the $R_{OH}$ groups of the monomer (MA) with at least a fraction of the hydrolysable groups Y of compound (M);
(b) reacting at least a fraction of hydroxyl groups of the $R_{OH}$ groups of said monomer (MA) of said polymer (F) with at least a fraction of said compound (M), so as to obtain a grafted polymer comprising pendant —$Y_{m-1}AX_{4-m}$ groups, with m, Y, A and X having same meaning as above detailed;

(c) hydrolyzing and/or polycondensing compound (M) and/or pendant —$Y_{m-1}AX_{4-m}$ groups, as above detailed to yield a fluoropolymer hybrid organic/inorganic composite comprising inorganic domains.

Further, the invention pertains to a fluoropolymer hybrid organic/inorganic composite [polymer (F-h)] comprising inorganic domains, said hybrid being obtained by reaction between:
at least one polymer (F), as above detailed; and
at least one compound (M), as above detailed,
wherein the inorganic domains are grafted to the polymer (F) through reaction of at least a fraction of the $R_{OH}$ groups of the monomer (MA) with at least a fraction of compound (M).

DESCRIPTION OF EMBODIMENTS

It has been surprisingly found that fluoropolymer hybrid organic/inorganic composites of the present invention exhibit improved properties, in particular, with regards to adhesion to glass or ceramic materials, and/or with regards to their enhanced scratch resistance. Also, when a compound (M) is used, fluoropolymer hybrid organic/inorganic composites are obtained which can exhibit functional behaviour, for instance in terms of hydrophilicity or ion conductivity.

The polymer (F) is a fluoropolymer comprising recurring units derived from at least one fluorinated monomer [monomer (FM)] and recurring units derived from at least one (meth)acrylic monomer [monomer (MA)].

By the term "fluorinated monomer" it is hereby intended to denote an ethylenically unsaturated monomer comprising at least one fluorine atom.

The term "at least one fluorinated monomer" is understood to mean that the polymer (F) may comprise recurring units derived from one or more than one fluorinated monomers. In the rest of the text, the expression "fluorinated monomers" is understood, for the purposes of the present invention, both in the plural and the singular, that is to say that they denote both one or more than one fluorinated monomers as defined above.

The term "at least one (meth)acrylic monomer [monomer (MA)]" is understood to mean that the polymer (F) may comprise recurring units derived from one or more than one (meth)acrylic monomers. In the rest of the text, the expression "(meth)acrylic monomers" is understood, for the purposes of the present invention, both in the plural and the singular, that is to say that they denote both one or more than one (meth)acrylic monomers as defined above.

Should the fluorinated monomer (FM) comprise at least one hydrogen atom, it is designated as hydrogen-containing fluorinated monomer.

Should the fluorinated monomer (FM) be free of hydrogen atoms, it is designated as per(halo)fluorinated monomer.

The fluorinated monomer (FM) may further comprise one or more other halogen atoms (Cl, Br, I).

Non-limiting examples of suitable fluorinated monomers (FM) include, notably, the followings:
$C_2$-$C_8$ perfluoroolefins such as tetrafluoroethylene and hexafluoropropylene;
$C_2$-$C_8$ hydrogenated fluoroolefins such as vinylidene fluoride, vinyl fluoride, 1,2-difluoroethylene and trifluoroethylene;
perfluoroalkylethylenes of formula $CH_2$=$CH$—$R_{f0}$ wherein $R_{f0}$ is a $C_1$-$C_6$ perfluoroalkyl;
chloro- and/or bromo- and/or iodo-$C_2$-$C_6$ fluoroolefins such as chlorotrifluoroethylene;

$CF_2=CFOX_0$ (per)fluoro-oxyalkylvinylethers wherein $X_0$ is a $C_1$-$C_{12}$ alkyl group, a $C_1$-$C_{12}$ oxyalkyl group or a $C_1$-$C_{12}$ (per)fluorooxyalkyl group having one or more ether groups, such as perfluoro-2-propoxy-propyl group;

(per)fluoroalkylvinylethers of formula $CF_2=CFOCF_2OR_{f2}$ wherein $R_{f2}$ is a $C_1$-$C_6$ fluoro- or perfluoroalkyl group, e.g. $CF_3$, $C_2F_5$, $C_3F_7$ or a $C_1$-$C_6$ (per)fluorooxyalkyl group having one or more ether groups such as —$C_2F_5$—O—$CF_3$;

functional (per)fluoro-oxyalkylvinylethers of formula $CF_2=CFOY_0$ wherein $Y_0$ is a $C_1$-$C_{12}$ alkyl group or (per)fluoroalkyl group, a $C_1$-$C_{12}$ oxyalkyl group or a $C_1$-$C_{12}$ (per)fluorooxyalkyl group having one or more ether groups and $Y_0$ comprising a carboxylic or sulfonic acid group, in its acid, acid halide or salt form;

fluorodioxoles, preferably perfluorodioxoles.

In a preferred embodiment according to the invention, the polymer (F) is advantageously a random polymer [polymer $(F_R)$] comprising linear sequences of randomly distributed recurring units derived from at least one fluorinated monomer (FM) at least one monomer (MA).

The expression "randomly distributed recurring units" is intended to denote the percent ratio between the average number of sequences of at least one monomer (MA), said sequences being comprised between two recurring units derived from at least one fluorinated monomer, and the total average number of recurring units derived from at least one monomer (MA).

When each of the recurring units derived from at least one monomer (MA) is isolated, that is to say that a recurring unit derived from a monomer (MA) is comprised between two recurring units of at least one fluorinated monomer, the average number of sequences of at least one monomer (MA) equals the average total number of recurring units derived from at least one monomer (MA), so that the fraction of randomly distributed recurring units derived from at least one monomer (MA) is 100%: this value corresponds to a perfectly random distribution of recurring units derived from at least one monomer (MA). Thus, the larger is the number of isolated recurring units derived from at least one monomer (MA) with respect to the total number of recurring units derived from at least one monomer (MA), the higher will be the percentage value of fraction of randomly distributed recurring units derived from at least one monomer MA).

The polymer (F) may further optionally comprise recurring units derived from at least one hydrogenated monomer, different from the monomer (MA).

By the term "hydrogenated monomer" it is hereby intended to denote an ethylenically unsaturated monomer comprising at least one hydrogen atom and free from fluorine atoms.

The term "at least one hydrogenated monomer" is understood to mean that the polymer (F) may comprise recurring units derived from one or more than one hydrogenated monomers. In the rest of the text, the expression "hydrogenated monomers" is understood, for the purposes of the present invention, both in the plural and the singular, that is to say that they denote either one or more than one hydrogenated monomers as defined above.

The polymer (F) may be amorphous or semi-crystalline.

The term "amorphous" is hereby intended to denote a polymer (F) having a heat of fusion of less than 5 J/g, preferably of less than 3 J/g, more preferably of less than 2 J/g, as measured according to ASTM D-3418-08.

The term "semi-crystalline" is hereby intended to denote a polymer (F) having a heat of fusion of from 10 to 90 J/g, preferably of from 30 to 60 J/g, more preferably of from 35 to 55 J/g, as measured according to ASTM D3418-08.

The polymer (F) is preferably semi-crystalline.

The polymer (F) comprises preferably at least 0.01% by moles, more preferably at least 0.05% by moles, even more preferably at least 0.1% by moles of recurring units derived from at least one monomer (MA).

The polymer (F) comprises preferably at most 10% by moles, more preferably at most 5% by moles, even more preferably at most 3% by moles of recurring units derived from at least one monomer (MA).

Determination of average mole percentage of recurring units derived from at least one monomer (MA)] in the polymer (F) can be performed by any suitable method. Mention can be notably made of acid-base titration methods or NMR methods.

The polymer (F) is preferably a partially fluorinated fluoropolymer.

For the purpose of the present invention, the term "partially fluorinated fluoropolymer" is intended to denote a polymer comprising recurring units derived from at least one fluorinated monomer (FM) and recurring units derived from at least one monomer (MA), wherein the fluorinated monomer (FM) comprises at least one hydrogen atom.

According to a first embodiment of the invention, the polymer (F) is preferably a partially fluorinated fluoropolymer comprising recurring units derived from vinylidene fluoride (VDF), at least one monomer (MA) and at least one fluorinated monomer [monomer (FM2)] different from VDF.

The polymer (F) of this first embodiment of the invention more preferably comprises recurring units derived from:

at least 60% by moles, preferably at least 75% by moles, more preferably at least 85% by moles of vinylidene fluoride (VDF), from 0.01% to 10% by moles, preferably from 0.05% to 5% by moles, more preferably from 0.1% to 3% by moles of at least one (meth)acrylic monomer (MA), and from 0.1% to 15% by moles, preferably from 0.1% to 12% by moles, more preferably from 0.1% to 10% by moles of at least one fluorinated monomer (FM2) selected from vinyl fluoride (VF1), chlorotrifluoroethylene (CTFE), hexafluoropropylene (HFP), tetrafluoroethylene (TFE) and trifluoroethylene (TrFE).

Non limitative examples of monomer (MA) comprising at least one hydroxyl end group include, notably, hydroxyethyl (meth)acrylate, hydroxypropyl(meth)acrylate, hydroxyethylhexyl(meth)acrylate.

The monomer (MA) is preferably selected from the followings:

hydroxyethyl acrylate (HEA) of formula:

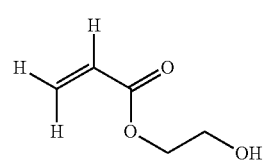

2-hydroxypropyl acrylate (HPA) of either of formulae:

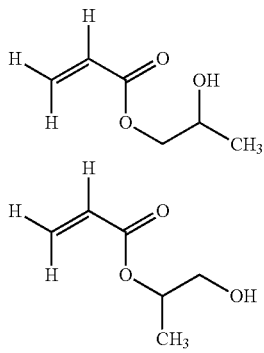

and mixtures thereof.

In a preferred embodiment according to the present invention, polymer (F) is a VDF/HEA/HFP terpolymer.

The polymer (F) is typically obtainable by polymerization of at least one fluorinated monomer, at least one monomer (MA) as above defined, and, optionally, a monomer (FM2).

The polymer (F) is typically obtainable by emulsion polymerization or suspension polymerization.

Preferably, the intrinsic viscosity of polymer (F), measured in dimethylformamide at 25° C., is lower than 0.50 l/g, more preferably lower than 0.45 l/g.

The polymer (F-h) typically comprises, preferably consists of, fluoropolymer domains and inorganic domains.

The selection of the hydrolysable group Y of the compound (M) of formula (I) as defined above is not particularly limited, provided that it enables under appropriate conditions the formation of a —O-A= bond between A of the compound (M) and the —O— atom belonging to the hydroxyl group on the $R_{OH}$ (meth)acrylic monomer (MA). The hydrolysable group Y of the compound (M) as defined above is typically selected from the group consisting of halogen atoms, preferably being a chlorine atom, hydrocarboxy groups, acyloxy groups and hydroxyl groups.

According to a preferred embodiment, X in compound (M) is $R^A$ and Y is $OR^B$, wherein $R^A$ and $R^B$, equal to or different from each other and at each occurrence, are independently selected from $C_1$-$C_{18}$ hydrocarbon groups, wherein $R^A$ optionally comprises at least one functional group.

In case the compound (M) as defined above comprises at least one functional group on X, it will be designated as functional compound (M1); in case none of X of the compound (M) as defined above comprise a functional group, the compound (M) will be designated as non-functional compound (M2).

Non-limiting examples of functional groups that can be on X include, notably, epoxy group, carboxylic acid group (in its acid, ester, amide, anhydride, salt or halide form), sulphonic group (in its acid, ester, salt or halide form), hydroxyl group, phosphoric acid group (in its acid, ester, salt, or halide form), thiol group, amine group, quaternary ammonium group, ethylenically unsaturated group (like vinyl group), cyano group, urea group, organo-silane group, aromatic group.

According to a more preferred embodiment, compound (M) is the compound (M1) wherein m is an integer from 1 to 3, A is a metal selected from the group consisting of Si, Ti and Zr, X is $R^{A'}$ and Y is $OR^{B'}$, wherein $R^{A'}$ is a $C_1$-$C_{12}$ hydrocarbon group comprising at least one functional group and $R_{B'}$ is a $C_1$-$C_5$ linear or branched alkyl group, preferably $R^{B'}$ being a methyl or ethyl group.

Examples of functional compounds (M1) are notably vinyltriethoxysilane, vinyltrimethoxysilane, vinyltrismethoxyethoxysilane of formula $CH_2$=$CHSi(OC_2H_4OCH_3)_3$, 2-(3,4-epoxycyclohexylethyltrimethoxysilane) of formula:

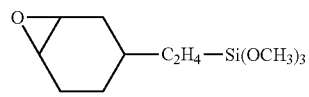

glycidoxypropylmethyldiethoxysilane of formula:

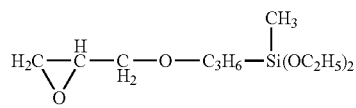

glycidoxypropyltrimethoxysilane of formula:

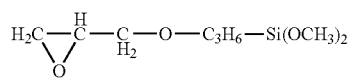

methacryloxypropyltrimethoxysilane of formula:

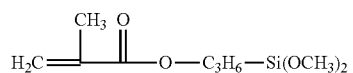

aminoethylaminpropylmethyldimethoxysilane of formula:

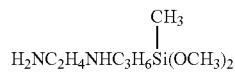

aminoethylaminpropyltrimethoxysilane of formula:

3-aminopropyltriethoxysilane, 3-phenylaminopropyltrimethoxysilane, 3-chloroisobutyltriethoxysilane, 3-chloropropyltrimethoxysilane, 3-mercaptopropyltriethoxysilane, 3-mercaptopropyltrimethoxysilane, n-(3-acryloxy-2-hydroxypropyl)-3-aminopropyltriethoxysilane, (3-acryloxypropyl)dimethylmethoxysilane, (3-acryloxypropyl)methyldichlorosilane, (3-acryloxypropyl)methyldimethoxysilane, 3-(n-allylamino)propyltrimethoxysilane, 2-(4-chlorosulfonylphenyl)ethyltrimethoxysilane, 2-(4-chlorosulphonylphenyl)ethyl trichlorosilane, carboxyethylsilanetriol, and its sodium salts, triethoxysilylpropylmaleamic acid of formula:

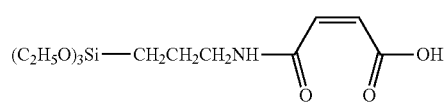

3-(trihydroxysilyl)-1-propane-sulphonic acid of formula $HOSO_2$—$CH_2CH_2CH_2$—$Si(OH)_3$, N-(trimethoxysilylpropyl)ethylene-diamine triacetic acid, and its sodium salts, 3-(triethoxysilyl)propylsuccinic anhydride of formula:

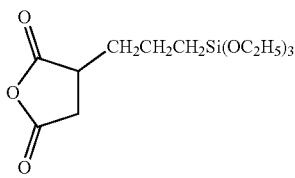

acetamidopropyltrimethoxysilane of formula $H_3C—C(O)NH—CH_2CH_2CH_2—Si(OCH_3)_3$, alkanolamine titanates of formula $Ti(L)_t(OR)_z$, wherein L is an amine-substituted alkoxy group, e.g. $OCH_2CH_2NH_2$, R is an alkyl group, and x and y are integers such that t+z=4.

Examples of non-functional compounds (M2) are notably trimethoxysilane, triethoxysilane, tetramethoxysilane, tetraethoxysilane (TEOS), tetramethyltitanate, tetraethyltitanate, tetra-n-propyltitanate, tetraisopropyltitanate, tetra-n-butyltitanate, tetra-isobutyl titanate, tetra-tert-butyl titanate, tetra-n-pentyltitanate, tetra-n-hexyltitanate, tetraisooctyltitanate, tetra-n-lauryl titanate, tetraethylzirconate, tetra-n-propylzirconate, tetraisopropylzirconate, tetra-n-butyl zirconate, tetra-sec-butyl zirconate, tetra-tert-butyl zirconate, tetra-n-pentyl zirconate, tetra-tert-pentyl zirconate, tetra-tert-hexyl zirconate, tetra-n-heptyl zirconate, tetra-n-octyl zirconate, tetra-n-stearyl zirconate.

According to another preferred embodiment, X in compound (M) is a $C_1$-$C_{12}$ hydrocarbon group comprising at least one —N=C=O functional group and wherein A and Y are as above defined; in this case, compound (M) will be designated compound (M').

According to a still more preferred embodiment, in compound (M') Y is $OR^D$, wherein $R^D$ is a $C_1$-$C_5$ linear or branched alkyl group, preferably $R^D$ being a methyl or ethyl group.

Non-limiting examples of suitable compounds (M') according to this embodiment include the followings: trimethoxysilyl methyl isocyanate, triethoxysilyl methyl isocyanate, trimethoxysilyl ethyl isocyanate, triethoxysilyl ethyl isocyanate, trimethoxysilyl propyl isocyanate, triethoxysilyl propyl isocyanate, trimethoxysilyl butyl isocyanate, triethoxysilyl butyl isocyanate, trimethoxysilyl pentyl isocyanate, triethoxysilyl pentyl isocyanate, trimethoxysilyl hexyl isocyanate and triethoxysilyl hexyl isocyanate.

According to a preferred embodiment, the at least one polymer (F-h) comprised in the membrane of the invention is obtained by reaction between:
  at least one [polymer (F)] as above defined,
  at least one metal compound (M') as above defined; and
  at least one metal compound (M2) as defined above.

With the aim of manufacturing polymer (F-h), which can exhibit functional behaviour in terms of hydrophilicity or ion conductivity, functional group of compound (M) will be preferably selected among carboxylic acid group (in its acid, ester, amide, anhydride, salt or halide form), sulphonic group (in its acid, ester, salt or halide form), hydroxyl group, phosphoric acid group (in its acid, ester, salt, or halide form), amine group, and quaternary ammonium group; most preferred will be carboxylic acid group (in its acid, ester, amide, anhydride, salt or halide form) and sulphonic group (in its acid, ester, salt or halide form).

The compound (M) preferably complies with formula:

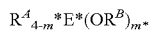

wherein m* is an integer from 2 to 3, E* is a metal selected from the group consisting of Si, Ti and Zr, $R^A$, equal to or different from each other at each occurrence, is a $C_1$-$C_{12}$ hydrocarbon group, optionally comprising one or more functional group; $R^B$, equal to or different from each other at each occurrence, is a $C_1$-$C_5$ linear or branched alkyl radical, preferably $R^B$ is methyl or ethyl.

The process of the invention comprises reacting at least a fraction of hydroxyl groups of $R_{OH}$ groups of said monomer (MA) of said polymer (F) with at least a fraction of said compound (M), so as to obtain a grafted polymer comprising pendant $—Y_{m-1}AX_{4-m}$ groups, with m, Y, A and X having same meaning as above detailed.

It is understood that —OH groups of the $R_{OH}$ functionalities of monomer (MA) are able to react with the hydrolysable group(s) of the compound (M) so as to yield a covalent bond between the compound (M) moiety and the monomer (MA) moiety.

For reacting hydroxyl groups of polymer (F) with compound (M) as above described, several techniques can be successfully used.

Polymer (F) and compound (M) can be notably reacted in the molten state; melt compounders such as extruders, melt kneaders or other devices can be advantageously used to this aim.

Polymer (F) and compound (M) can be also notably reacted in solution; according to this embodiment polymer (F) and compound (M) are at least partially dissolved in a solvent. Dissolution can be obtained either at room temperature or upon heating. The selection of this solvent is not critical, provided that it efficiently solvates both polymer (F) and compound (M) and does not interfere with the reaction between the hydroxyl groups of polymer (F) and the hydrolysable groups of compound (M).

Generally, polar aprotic solvent will be preferably selected. Among these solvents, mention can be notably made of N,N-dimethylformamide (DMF), N,N-dimethylacetamide, tetramethylurea, dimethylsulfoxide (DMSO), triethylphosphate, N-methyl-2-pyrrolidone (NMP), acetone, tetrahydrofuran, methylethylketone (MEK), methylisobutylketone (MIBK), glycol diethers, glycol ether-esters, n-butylacetate, cyclohexanone, diisobutylketone, butyrolactone, isophorone, propylene carbonate, glyceryl triacetate, dimethyl phthalate.

According to an embodiment of the invention, the mixture can further comprise, in addition to compound (M) and polymer (F), at least one inorganic filler.

The inorganic filler is generally provided in the mixture under the form of particles.

The inorganic filler particles generally have an average particles size of 0.001 μm to 1000 μm, preferably of 0.01 μm to 800 μm, more preferably of 0.03 μm to 500 μm.

The choice of the inorganic filler is not particularly limited; nevertheless, inorganic fillers having on their surface reactive groups towards compound (M) are generally preferred.

Among surface reactive group, mention is notably made of hydroxyl groups.

Without being bound by this theory, the Applicant believes that reaction between at least a fraction of compound (M) with at least a fraction of said surface reactive group of the inorganic filler can occur simultaneously with the reaction of at least a fraction of compound (M) with at least a fraction of the $R_{OH}$ groups of the monomer (MA), so that in subsequent hydrolysis/polycondensation step, chemical bonding between the polymer (F) and the inorganic filler is likely achieved through the inorganic domains derived from compound (M).

Among inorganic fillers suitable for being used in the process of the invention, mention can be made of inorganic oxides, including mixed oxides, metal sulphates, metal carbonates, metal sulfides and the like.

Among metal oxides, mention can be made of $SiO_2$, $TiO_2$, $ZnO$, $Al_2O_3$.

A class of compounds which gave particularly good results within the context of this embodiment of the present invention are notably silicates, aluminium-silicates and magnesium silicates, all optionally containing additional metals such as sodium, potassium, iron or lithium.

These silicates, aluminium-silicates and magnesium silicates are generally known as possessing a layered structure.

These silicates, aluminium-silicates and magnesium silicates, all optionally containing additional metals such as sodium, potassium, iron or lithium can be notably smectic clays, possibly of natural origin, such as notably montmorillonites, sauconite, vermiculite, hectorite, saponite, nontronite. As an alternative, silicates, aluminium-silicates and magnesium silicates, all optionally containing additional metals such as sodium, potassium, iron or lithium can be selected among synthetic clays, like notably fluorohectorite, hectorite, laponite.

Best results have been obtained with particles of layered silicates, aluminium-silicates and magnesium silicates as above described having at least one dimension of less than 100 nm, preferably of less than 50 nm, more preferably of less than 10 nm.

According to this embodiment, fluoropolymer hybrid organic/inorganic composites of the invention comprise said inorganic fillers. Said inorganic fillers are typically comprised in the inorganic domains of the composite of the invention.

The process further comprises hydrolyzing and/or polycondensing compound (M) and/or pendant $—Y_{m-1}AX_{4-m}$ groups, as above detailed to yield a fluoropolymer hybrid organic/inorganic composite comprising inorganic domains.

The hydrolysis/polycondensation can be carried out simultaneously to the step of reacting hydroxyl groups of polymer (F) and compound (M) or can be carried out once said reaction has occurred.

Typically, in particular for compounds wherein A=Si, this hydrolysis/polycondensation is initiated by addition of appropriate catalyst/reactant. Generally, water or a mixture of water and an acid can be used for promoting this reaction.

The choice of the acid is not particularly limited; both organic and inorganic acids can be used. HCl is among the preferred acids which can be used in the process of the invention.

In case of reaction between polymer (F) and compound (M) in the molten state, injection of water vapour, optionally in combination with a volatile acid, will be the preferred method for promoting the hydrolysis/polycondensation.

In case of reaction between polymer (F) and compound (M) in solution, addition of an aqueous medium preferably comprising an acid will be the preferred method for promoting the hydrolysis/polycondensation.

While this hydrolysis/polycondensation can take place at room temperature, it is generally preferred to carry out this step upon heating at a temperature exceeding 50° C.

In case of reaction in the molten state, temperatures will range from 150 to 250° C. as a function of the melting point of the polymer (F); in case of reaction in solution, temperatures will be selected having regards to the boiling point of the solvent. Generally temperatures between 50 and 150° C., preferably between 60° C. and 120° C. will be preferred.

It is understood that in this step, hydrolysable group(s) of the compound (M) will react so as to yield a hybrid composite comprising fluoropolymer domain (2) consisting of chains of polymer (F) and inorganic domains (1) consisting of residues derived from compound (M).

The fluoropolymer hybrid organic/inorganic composite comprising inorganic domains can be recovered from standard methods, which will depend upon techniques used in various reaction steps.

Also other aspects of the invention pertain to the use of the fluoropolymer hybrid organic/inorganic composites of the present invention in different fields of use.

According to one aspect of the present invention, the fluoropolymer hybrid organic/inorganic composites of the present invention are used for the treatment of glass and/or ceramic materials. In particular, the invention pertains to the use of said composite comprising coating a glass and/or a ceramic surface with a layer comprising said composite. Said layer comprising the inventive composite can be used as aesthetic finish, in particular possibly in admixture with pigments or other fillers, or can be used as shatterproof coating.

Still under the scope of this embodiment is the use of said composite for manufacturing multilayer structures comprising a glass and/or ceramic substrate bound to a fluoropolymer layer through a layer comprising the composite as above defined.

Still the composite of the invention can be used as a coating on different substrates for conferring scratch resistance. While the selection of materials which can be successfully coated with the composite of the invention is not particularly limited, it is generally understood that plastic materials will be preferred.

Further, composites of the present invention, in particular those composites which are obtained by reaction between polymer (F) and a functional compound (M) can be used as raw materials for the manufacture of membranes for electrochemical applications and/or for separation processes. In particular, preferred composites for this use are those wherein the functional compound (M) used for their manufacture comprise a functional group selected from the group consisting of carboxylic acid group (in its acid, ester, amide, anhydride, salt or halide form), sulphonic group (in its acid, ester, salt or halide form), hydroxyl group, phosphoric acid group (in its acid, ester, salt, or halide form), amine group, and quaternary ammonium group; preferably from the group consisting of carboxylic acid group (in its acid, ester, amide, anhydride, salt or halide form) and sulphonic group (in its acid, ester, salt or halide form). Within this embodiment, inventive composites can be used for the manufacture of separators for Lithium batteries, for manufacturing ion-conductive membranes for fuel cells, for manufacturing membranes for filtration.

Further, composites of the present invention, in particular those composites which are obtained by reaction between polymer (F) and a functional compound (M) can be used as electroluminescent materials in photovoltaic or organic light emitting devices.

In particular, preferred composites for this use are those wherein the functional compound (M) used for their manufacture comprise a functional group having electro-optic properties, such as notably hole transport capabilities, electron transport capabilities, chromophores and the like. Among these groups, mention can be made of functional groups comprising carbazoles, oxadiazoles, tetraphenylenetetramine, dicyanomethylene-4-H-pyran, naphtalimide groups.

In this case, the use of composites of the present invention in the field of optics exploit combination of properties such as transparency, good adhesion, barrier properties, corrosion protection, easy tuning of refractive index, adjustable mechanical properties and decorative properties.

An extensive review of possible uses of the composites of the present invention made from functional compound (M) comprising a functional group having electro-optic properties is provided in SANCHEZ, Clement, et al. "Optical Properties of Functional Hybrid Organic-Inorganic Nanocomposites". *Advanced Materials*. Mar. 12, 2003, vol. 15, no. 23, p. 1969-1994.

Still, composites of the present invention can be used for coating surfaces comprising superficial hydroxyl groups; in this case, application of the composite can be performed during the hydrolysis/polycondensation phase so as to have compound (M) possibly establishing a chemical bond with the surface to be coated. Cellulose-based surfaces can be notably used within this approach so as to yield corresponding coated surfaces comprising the composite of the invention. Among substrates suitable as substrates, mention can be made of textiles, fabrics (e.g. for clothing), wood parts ('e.g. for furniture), paper (e.g. for packaging).

Should the disclosure of any patents, patent applications, and publications which are incorporated herein by reference conflict with the description of the present application to the extent that it may render a term unclear, the present description shall take precedence.

The invention will be now described with reference to the following examples whose purpose is merely illustrative and not limitative of the present invention.

EXAMPLES

Raw Materials
Polymer 1-Comp: VDF-HEA (0.8% by moles)-HFP (2.4% by mole) polymer having an intrinsic viscosity of 0.077 l/g in DMF at 25° C.
Polymer (F-A): VDF-HEA (0.6% by moles)-HFP (2.5% by mole) polymer having an intrinsic viscosity of 0.097 l/g in DMF at 25° C.
Polymer (F-B): VDF-HEA (0.2% by moles) polymer having an intrinsic viscosity of 0.30 l/g in DMF at 25° C.
Polymer (F-C): VDF-HEA (0.5% by moles) polymer having an intrinsic viscosity of 0.135 l/g in DMF at 25° C.
Polymer (F-D): VDF-HEA (0.4% by moles) polymer having an intrinsic viscosity of 0.157 l/g in DMF at 25° C.

Example 1

Synthesis of Polymer 1-Comp

In a 80 l reactor equipped with an impeller running at a speed of 300 rpm were introduced in sequence 58242 g of demineralised water and 11.1 g of METHOCEL® K100 GR suspending agent (commercially available from Dow). The reactor was purged with sequence of vacuum (30 mmHg) and purged of nitrogen at 14° C. Then 149.9 g of a 75% by weight solution of t-amyl perpivalate initiator in isododecane was introduced in the reactor. Then 21.6 g of hydroxyethylacrylate (HEA) and 1873 g of hexafluoropropylene (HFP) monomers were introduced in the reactor. Finally, 16597 g of vinylidene fluoride (VDF) were added. The reactor was gradually heated until a set-point temperature at 57° C. and the pressure was fixed at 110 bar. The pressure was kept constantly equal to 110 bars by feeding 13 kg of aqueous solution containing a 240.6 g of HEA during the polymerization. After this feeding, no more aqueous solution was introduced and the pressure started to decrease until 80 bar. Then, the polymerization was stopped by degassing the reactor until reaching atmospheric pressure. In general a conversion around 75% of monomers was obtained. The polymer so obtained was then recovered, washed with demineralised water and oven-dried at 65° C.

Example 2

Synthesis of Polymer (F-A)

In a 80 litres reactor equipped with an impeller running at a speed of 250 rpm were introduced in sequence 49992 g of demineralised water and 15.2 g of METHOCEL® K100 GR suspending agent. The reactor was purged with sequence of vacuum (30 mmHg) and purged of nitrogen at 20° C. Then 204.4 g of a 75% by weight solution of t-amyl perpivalate initiator in isododecane was introduced. The speed of the stirring was increased at 300 rpm. Finally, 20.4 g of hydroxyethylacrylate (HEA) and 2555 g of hexafluoropropylene (HFP) monomers were introduced in the reactor, followed by 22735 g of vinylidene fluoride (VDF). The reactor was gradually heated until a set-point temperature at 55° C. and the pressure was fixed at 120 bar. The pressure was kept constantly equal to 120 bars by feeding 16.9 kg of aqueous solution containing 235 g of HEA during the polymerization. After this feeding, no more aqueous solution was introduced and the pressure started to decrease until 90 bar. Then, the polymerization was stopped by degassing the reactor until reaching atmospheric pressure. In general a conversion around 76% of monomers was obtained. The polymer so obtained was then recovered, washed with demineralised water and oven-dried at 65° C.

Example 3

Synthesis of Polymer (F-B)

In a 80 litres reactor equipped with an impeller running at a speed of 250 rpm were introduced in sequence 53435 g of demineralised water and 18.3 g of METHOCEL® K100 GR suspending agent. The reactor was purged with sequence of vacuum (30 mmHg) and purged of nitrogen at 20° C. Then 76.6 g of a 75% by weight solution of t-amyl perpivalate initiator in isododecane was added. The speed of the stirring was increased at 300 rpm. Finally, 5.8 g of hydroxyethylacrylate (HEA) were introduced in the reactor, followed by 22919 g of vinylidene fluoride (VDF). The reactor was gradually heated until a set-point temperature at 48° C. and the pressure was fixed at 120 bar. The pressure was kept constantly equal to 120 bars by feeding 14.54 kg of aqueous solution containing at 4.55 g/kg of HEA in water during the polymerization. After this feeding, no more aqueous solution was introduced and the pressure started to decrease until 115 bar. Then, the polymerization was stopped by degassing the reactor until reaching atmospheric pressure. In general a conversion around 79% of comonomers was obtained. The polymer so obtained was then recovered, washed with demineralised water and oven-dried at 65° C.

Example 4

Synthesis of Polymer (F-C)

In a 4 litres reactor equipped with an impeller running at a speed of 650 rpm were introduced in sequence 2150 g of demineralised water and 0.93 g of METHOCEL® K100 GR suspending agent. The reactor was purged with sequence of vacuum (30 mmHg) and purged of nitrogen at 20° C. Then 9.34 g of a 75% by weight solution of t-amyl perpivalate initiator in isododecane was added. The speed of the stirring was increased at 880 rpm. Finally, 0.38 g of hydroxyethylacrylate (HEA) were introduced in the reactor, followed by 1166 g of vinylidene fluoride (VDF). The reactor was gradually heated until a set-point temperature at 55° C. and the pressure was fixed at 120 bar. The pressure was kept constantly equal to 120 bars by feeding 834 g of aqueous solution containing 9 g of HEA. After this feeding, no more aqueous solution was introduced and the pressure started to decrease until 115 bar. Then, the polymerization was stopped by degassing the reactor until reaching atmospheric pressure. In general a conversion around 78% of comonomers was obtained. The polymer so obtained was then recovered, washed with demineralised water and oven-dried at 65° C.

Example 5

Synthesis of Polymer (F-D)

In a 4 litres reactor equipped with an impeller running at a speed of 650 rpm were introduced in sequence 2244 g of demineralised water and 0.93 g of METHOCEL® K100 GR suspending agent. The reactor was purged with sequence of vacuum (30 mmHg) and purged of nitrogen at 20° C. Then 9.34 g of a 75% by weight solution of t-amyl perpivalate initiator in isododecane was introduced. The speed of the stirring was increased at 880 rpm. Finally, 0.33 g of hydroxyethylacrylate (HEA) were introduced in the reactor, followed by 1168 g of vinylidene fluoride (VDF). The reactor was gradually heated until a set-point temperature at 48° C. and the pressure was fixed at 120 bar. The pressure was kept constantly equal to 120 bars by feeding 767 g of aqueous solution containing 7.9 g of HEA.

After this feeding, no more aqueous solution was introduced and the pressure started to decrease until 115 bar. Then, the polymerization was stopped by degassing the reactor until reaching atmospheric pressure. In general a conversion around 76% of comonomers was obtained. The polymer so obtained was then recovered, washed with demineralised water and oven-dried at 65° C.

Example 6

General Procedure for Preparing a Solution of a Hybrid Polymer/Silica Composite Hybrid Polymer/Silica Composite Comprising 10% of Silica 3 grams of the polymer prepared according to any of examples 1 to 5 were dissolved in 27 grams of N-methylpyrrolidone (NMP). Then, 1.156 grams of TEOS were added drop-wise to the stirred solution, followed by 0.555 ml of aqueous HCl (0.1 M); the mixture was stirred at 60° C. for 2 hours to ensure the sol-gel reaction (TEOS hydrolysis and polycondensation) so as to obtain a clear solution of a hybrid VDF-HEA/silica composite. The silica content, calculated assuming complete TEOS hydrolysis/polycondensation to $SiO_2$, was 10% wt. referred to the composite.

Hybrid Polymer/Silica Composite Comprising 20% of Silica 2.5 grams of the polymer prepared according to any of examples 1 or 2 were dissolved in 22.5 grams of N-methylpyrrolidone (NMP). Then, 2.167 grams of TEOS were added drop-wise to the stirred solution, followed by 1.040 ml of aqueous HCl (0.1 M); the mixture was stirred at 60° C. for 2 hours to ensure the sol-gel reaction (TEOS hydrolysis and polycondensation) so as to obtain a clear solution of a hybrid VDF-HEA/silica composite. The silica content, calculated assuming complete TEOS hydrolysis/polycondensation to $SiO_2$, was 20% wt referred to the composite.

Example 7

Coating of a Glass Substrate with the Hybrid Polymer/Silica Composite

The solutions obtained according to example 6 were casted with a Doctor Blade system on a glass plate, and solvent was removed at 120° C.

The resulting films were smooth, homogeneous, and opaque. Wet Film thickness was about 500 µm. Dry Film thickness was about 25-35 µm.

Example 8

Tensiles Properties

Mechanical properties of films obtained as described in example 7 were evaluated according to ASTM D-638 type V standard, by measuring tensile properties at room temperature.

The results are shown in Table 1.

TABLE 1

| Composition | Modulus [Mpa] | Yield Stress [Mpa] | Yield Strain [%] | Stress at break [Mpa] |
|---|---|---|---|---|
| Polymer (F-A) with $SiO_2$ 10% | 999 | 29 | 3.9 | 24.3 |
| Polymer (F-A) with $SiO_2$ 20% | 1289 | 34.8 | 3.7 | 38.1 |
| Polymer 1-Comp with $SiO_2$ 10% | 844 | 26.3 | 4.1 | 25.4 |
| Polymer 1-Comp with $SiO_2$ 20% | 983 | 31.3 | 4.2 | 26.5 |

Example 9

Cross Cut

Adhesion among glass and hybrid composite film was determined according to ISO 2409 standard and according to ASTM D-3359. The results are shown in Table 2.

TABLE 2

| Composition | ISO | ASTM |
|---|---|---|
| Polymer (F-A) with $SiO_2$ 10% | 0 | 5B |
| Polymer (F-A) with $SiO_2$ 20% | 0 | 5B |
| Polymer 1-Comp with $SiO_2$ 10% | 1 | 4B |
| Polymer 1-Comp with $SiO_2$ 20% | 1 | 4B |
| Polymer (F-B) with $SiO_2$ 10% | 0 | 5B |
| Polymer (F-C) with $SiO_2$ 10% | 0 | 5B |

TABLE 2-continued

| Composition | ISO | ASTM |
|---|---|---|
| Polymer (F-D) with SiO$_2$ 10% | 0 | 5B |

Under ISO 2409 standard, rating ranges from 0 (complete adhesion) to 5 (no adhesion at all).

Under ASTM D 3359, rating ranges from OB (no adhesion at all) to 5B (complete adhesion).

Only hybrids of the invention made by reaction of the compound (M) and the polymer (F) having an intrinsic viscosity higher than 0.09 l/g in DMF at 25° C. have been found to provide for outstanding adhesion performances.

Sol-gel reaction on the VDF-HEA-HFP terpolymers (polymer 1-Comp) having an intrinsic viscosity lower than 0.09 l/g in DMF at 25° C. has been shown to provide a lower adhesion to glass.

The invention claimed is:

1. A polymer (F-h), wherein polymer (F-h) is a fluoropolymer hybrid organic/inorganic composite comprising fluoropolymer domains and inorganic domains, said polymer (F-h) being obtained by reaction between:
at least one polymer (F), wherein polymer (F) is at least one fluoropolymer comprising:
(i) recurring units derived from at least one fluorinated monomer (FM)
(ii) recurring units derived from at least one (meth)acrylic monomer (MA) of formula:

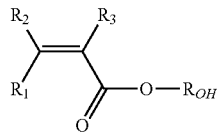

wherein each of R$_1$, R$_2$, R$_3$, equal or different from each other, is independently a hydrogen atom or a C$_1$-C$_3$ hydrocarbon group, and R$_{OH}$ is a C$_1$-C$_5$ hydrocarbon moiety comprising at least one hydroxyl groups, and
(iii) optionally recurring units derived from at least one fluorinated monomer (FM2) different from VDF;
wherein polymer (F) has an intrinsic viscosity measured in dimethylformamide at 25° C. higher than 0.09 l/g and lower than 0.6 l/g;
and
at least one metal compound (M) of formula (I):

$$X_{4-m}AY_m \qquad (I)$$

wherein m is an integer from 1 to 4, A is a metal selected from the group consisting of Si, Ti and Zr, Y is a hydrolysable group, X is a hydrocarbon group, optionally comprising one or more functional groups,
wherein the fluoropolymer domains derive from polymer (F) and the inorganic domains derive from compound (M), and
wherein the inorganic domains are grafted to the fluoropolymer domains through reaction of at least a fraction of the R$_{OH}$ groups of the monomer (MA) with at least a fraction of the hydrolysable groups Y of compound (M).

2. The polymer (F-h) according to claim 1, wherein the at least one polymer (F) is a partially fluorinated fluoropolymer comprising recurring units derived from vinylidene fluoride (VDF), at least one (meth)acrylic monomer (MA) and at least one fluorinated monomer (FM2) different from VDF.

3. The polymer (F-h) according to claim 2, wherein polymer (F) comprises recurring units derived from:
at least 60% by moles of vinylidene fluoride (VDF),
from 0.01% to 10% by moles of at least one monomer (MA), and
from 0.1% to 15% by moles of at least one monomer (FM2) selected from vinyl fluoride (VF$_1$), chlorotrifluoroethylene (CTFE), hexafluoropropylene (HFP), tetrafluoroethylene (TFE) and trifluoroethylene (TrFE).

4. The polymer (F-h) according to claim 3, wherein polymer (F) comprises recurring units derived from:
at least 75% by moles of vinylidene fluoride (VDF),
from 0.05% to 5% by moles of at least one monomer (MA), and
from 0.1% to 12% by moles of at least one monomer (FM2) selected from vinyl fluoride (VF1), chlorotrifluoroethylene (CTFE), hexafluoropropylene (HFP), tetrafluoroethylene (TFE) and trifluoroethylene (TrFE).

5. The polymer (F-h) according to claim 4, wherein polymer (F) comprises recurring units derived from:
at least 85% by moles of vinylidene fluoride (VDF),
from 0.1% to 3% by moles of at least one monomer (MA), and
from 0.1% to 10% by moles of at least one monomer (FM2) selected from vinyl fluoride (VF$_1$), chlorotrifluoroethylene (CTFE), hexafluoropropylene (HFP), tetrafluoroethylene (TFE) and trifluoroethylene (TrFE).

6. The polymer (F-h) according to claim 1, wherein monomer (MA) is selected from the group consisting of:
hydroxyethylacrylate (HEA) of formula:

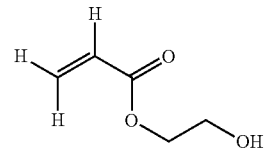

2-hydroxypropyl acrylate (HPA) of either of formulae:

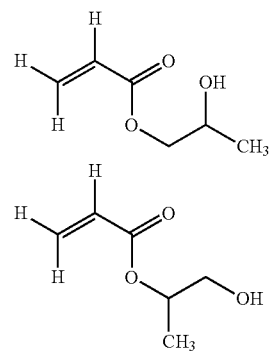

acrylic acid (AA) of formula:

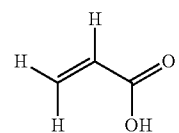

and mixtures thereof.

7. The polymer (F-h) according to claim 1, wherein the intrinsic viscosity of polymer (F), measured in dimethylformamide at 25° C., is lower than 0.50 l/g.

8. The polymer (F-h) according to claim 1, wherein X in compound (M) is $R^A$ and Y is $OR^B$, wherein $R^A$ and $R^B$, equal to or different from each other and at each occurrence, are independently selected from $C_1$-$C_{18}$ hydrocarbon groups, wherein $R^A$ optionally comprises at least one functional group.

9. The polymer (F-h) according to claim 1, wherein compound (M) is a functional compound (M1) selected from the group consisting of: vinyltriethoxysilane, vinyltrimethoxysilane, vinyltrismethoxyethoxysilane of formula $CH_2=CHSi(OC_2H_4OCH_3)_3$, 2-(3,4-epoxycyclohexylethyltrimethoxysilane) of formula:

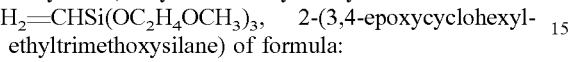

glycidoxypropylmethyldiethoxysilane of formula:

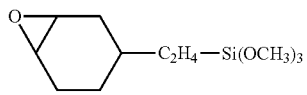

glycidoxypropyltrimethoxysilane of formula:

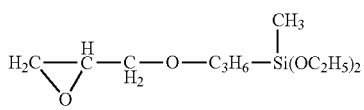

methacryloxypropyltrimethoxysilane of formula:

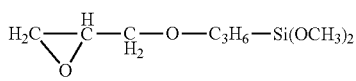

aminoethylaminpropylmethyldimethoxysilane of formula:
aminoethylaminpropyltrimethoxysilane of formula:
3-aminopropyltriethoxysilane, 3-phenylaminopropyltrimethoxysilane,

3-chloroisobutyltriethoxysilane, 3-chloropropyltrimethoxysilane, 3-mercaptopropyltriethoxysilane, 3-mercaptopropyltrimethoxysilane, n-(3-acryloxy-2-hydroxypropyl)-3-aminopropyltriethoxysilane, (3-acryloxypropyl)dimethylmethoxysilane, (3-acryloxypropyl)methyldichlorosilane, (3-acryloxypropyl)methyldimethoxysilane, 3-(n-allylamino)propyltrimeth- oxysilane, 2-(4-chlorosulfonylphenyl)ethyltrimethoxysilane, 2-(4-chlorosulphonylphenyl)ethyl trichlorosilane, carboxyethylsilanetriol, and its sodium salts, triethoxysilylpropylmaleamic acid of formula:

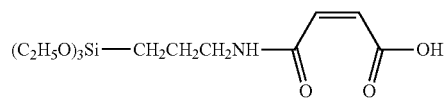

3-(trihydroxysilyl)-I-propane-sulphonic acid of formula $HOSO_2$—$CH_2CH_2CH_2$—$Si(OH)_3$, N-(trimethoxysilylpropyl)ethylene-diamine triacetic acid, and its sodium salts,
3-(triethoxysilyl) propylsuccinic anhydride of formula:

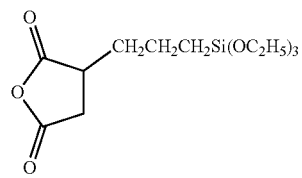

acetamidopropyltrimethoxysilane of formula $H_3C$—$C(O)NH$—$CH_2CH_2CH_2$—$Si(OCH_3)_3$, and alkanolamine titanates of formula Ti(L)t(OR)z, wherein L is an amine-substitued alkoxy group, R is an alkyl group, and x and y are integers such that t+z=4.

10. The polymer (F-h) according to claim 1, wherein compound (M) is a non-functional compound (M2) selected from the group consisting of: trimethoxysilane, triethoxysilane, tetramethoxysilane, tetraethoxysilane (TEOS), tetramethyltitanate, tetraethyltitanate, tetra-n-propyltitanate, tetraisopropyltitanate, tetra-n-butyltitanate, tetra-isobutyl titanate, tetra-tert-butyl titanate, tetra-n-pentyltitanate, tetra-n-hexyltitanate, tetraisooctyltitanate, tetra-n-lauryl titanate, tetraethylzirconate, tetra-n-propylzirconate, tetraisopropylzirconate, tetra-n-butyl zirconate, tetra-sec-butyl zirconate, tetra-tert-butyl zirconate, tetra-n-pentyl zirconate, tetra-tert-pentyl zirconate, tetra-tert-hexyl zirconate, tetra-n-heptyl zirconate, tetra-n-octyl zirconate and tetra-n-stearyl zirconate.

11. The polymer (F-h) according to claim 1, wherein compound (M) is a compound (M') selected from the group consisting of: trimethoxysilyl methyl isocyanate, triethoxysilyl methyl isocyanate, trimethoxysilyl ethyl isocyanate, triethoxysilyl ethyl isocyanate, trimethoxysilyl propyl isocyanate, triethoxysilyl propyl isocyanate, trimethoxysilyl butyl isocyanate, triethoxysilyl butyl isocyanate, trimethoxysilyl pentyl isocyanate, triethoxysilyl pentyl isocyanate, trimethoxysilyl hexyl isocyanate and triethoxysilyl hexyl isocyanate.

12. The polymer (F-h) according to claim 1, further comprising inorganic fillers comprised in said inorganic domains.

13. A method for treating glass and/or ceramic materials, the method comprising using the polymer (F-h) according to claim 1.

14. The method according to claim 13, comprising coating a glass and/or ceramic surface with a layer comprising the polymer (F-h) according to claim 1.

15. The method according to claim 13, comprising bonding a glass and/or a ceramic substrate to a fluoropolymer layer through a layer comprising the polymer (F-h) according to claim 1, thus forming a multilayer structure.

16. A membrane for electrochemical applications and/or separation processes, the membrane comprising the polymer (F-h) according to claim 1.

17. An electroluminescent material in a photovoltaic or organic light emitting device, the electroluminescent material comprising the polymer (F-h) according to claim 1.

18. A process for manufacturing a polymer (F-h), wherein polymer (F-h) is a fluoropolymer hybrid organic/inorganic composite, said process comprising:

(a) providing a mixture of:
  at least one polymer (F), wherein polymer (F) is at least one fluoropolymer comprising:
  (i) recurring units derived from at least one fluorinated monomer (FM),
  (ii) recurring units derived from at least one (meth)acrylic monomer (MA) of formula:

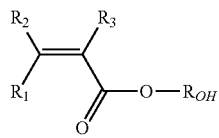

wherein each of R1, R2, R3, equal or different from each other, is independently a hydrogen atom or a $C_1$-$C_3$ hydrocarbon group, and $R_{OH}$ is a $C_1$-$C_5$ hydrocarbon moiety comprising at least one hydroxyl group, and (iii) optionally recurring units derived from at least one fluorinated monomer (FM2) different from VDF;

wherein polymer (F) has an intrinsic viscosity measured in dimethylformamide at 25° C. higher than 0.09 l/g and lower than 0.6 l/g;

and at least one metal compound (M) of formula (I):

$$X_{4-m}AY_m \quad (1)$$

wherein m is an integer from 1 to 4, A is a metal selected from the group consisting of Si, Ti and Zr, Y is a hydrolysable group, X is a hydrocarbon group, optionally comprising one or more functional groups, (b) reacting at least a fraction of hydroxyl groups of the $R_{OH}$ groups of said monomer (MA) of said polymer (F) with at least a fraction of said compound (M), so as to obtain a grafted polymer comprising pendant —$Y_{m-1}AX_{4-m}$ groups, with m, Y, A and X having same meaning as above detailed;

(c) hydrolyzing and/or polycondensing compound (M) and/or pendant —$Y_{m-1}AX_{4-m}$ groups, as above detailed to yield a polymer (F-h) comprising inorganic domains.

* * * * *